(12) United States Patent
Oakley et al.

(10) Patent No.: US 7,531,944 B2
(45) Date of Patent: May 12, 2009

(54) PIEZOELECTRIC ACTUATOR AND ENCLOSURE THEREFOR

(75) Inventors: Charles D. Oakley, Davison, MI (US); Jack C. Webb, Davison, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/704,666

(22) Filed: Feb. 9, 2007

(65) Prior Publication Data

US 2008/0191586 A1 Aug. 14, 2008

(51) Int. Cl.
*H01L 41/053* (2006.01)
(52) U.S. Cl. .................. 310/340; 310/328; 310/346
(58) Field of Classification Search ............ 310/340, 310/328, 346
See application file for complete search history.

(56) References Cited

U.S. PATENT DOCUMENTS

| 5,208,506 | A | * | 5/1993 | Yamashita | 310/328 |
| 5,334,902 | A | * | 8/1994 | Inoi | 310/344 |
| 5,477,102 | A | * | 12/1995 | Miyoshi | 310/344 |
| 6,315,216 | B1 | * | 11/2001 | Boecking | 239/102.2 |
| 7,036,198 | B2 | * | 5/2006 | Hardy et al. | 29/25.35 |
| 2003/0107301 | A1 | * | 6/2003 | Asano et al. | 310/328 |

* cited by examiner

*Primary Examiner*—Quyen P Leung
*Assistant Examiner*—Bryan P Gordon
(74) *Attorney, Agent, or Firm*—David P. Wood

(57) ABSTRACT

An enclosure for enclosing piezoelectric elements of a piezoelectric actuator comprises a side wall that is shaped to define at least one strain compensation formation selected from a longitudinally-extensible part at which the side wall can be extended or contracted parallel to a longitudinal axis of the enclosure; and an inwardly-deflectable part at which the side wall can be deflected transversely to the longitudinal axis.

31 Claims, 4 Drawing Sheets

PIEZOELECTRIC ACTUATOR AND ENCLOSURE THEREFOR

BACKGROUND OF THE INVENTION

1. Field of the Invention

This invention relates to a piezoelectric actuator and to an enclosure for piezoelectric elements of such an actuator. The actuator of the invention is suitable for use in a fuel injector for an internal combustion engine, particularly a diesel engine.

2. Description of Prior Art

In a known fuel injector as described in the Applicant's granted patent EP 0995901, a piezoelectric actuator is operable to control the delivery of fuel into a combustion space. Such an actuator typically includes a stack of piezoelectric elements or segments, each approximately 80 microns thick at rest. A variable voltage is applied across each element in use; in response to varying voltage across each element, the stack lengthens and contracts along the central axis of the actuator. The changing length of the stack moves an injector valve needle with respect to a valve seat and thereby controls injection of fuel.

More specifically, the piezoelectric elements of the stack are of polarized piezoelectric material interleaved with internal metallic electrodes. The elements of the stack are separated by and bonded to the electrodes, each of which is capable of providing the necessary voltage to two adjacent piezoelectric elements. The electrodes therefore alternate in polarity along the stack. Edges of the electrodes are exposed on the side surfaces of the stack.

The voltage potential between neighbouring electrodes typically varies from +200V to −60V, depending upon the status of the actuator. When the actuator is required to close the injector valve, the piezoelectric stack is lengthened by about 120 microns by the application of +200V to the elements of the stack. The actuator thereby causes the valve needle of the injector to close against the valve seat, blocking the fuel path. To maintain the injector valve in its closed state, that voltage must be applied continually to the stack except when an injection of fuel is required, at which point a negative voltage of −60V is applied to the electrodes. This causes the stack to contract, retracting the injector valve needle from the valve seat to open the fuel path very briefly. A negative voltage is used for speed of retraction.

The actuator is disposed within an accumulator volume in the injector that receives high-pressure fuel in use. The actuator is therefore immersed in fuel throughout its operational life; moreover, when the fuel injection system is in use, the actuator is exposed to fuel at rail pressure cycling from, for example, 200 to 2000 bar. To protect the piezoelectric stack from damage, it is important that the stack is sealed off from the chemical and dielectric effects of fuel within the accumulator volume. These effects are worsened by water contamination that is typically present in the fuel.

Without an effective barrier between the fuel and the piezoelectric stack, surface short-circuiting can occur between the exposed edges of the electrodes that alternate in polarity along the stack. When short-circuiting occurs, the result is a loss of useful function due to alteration of the piezoelectric material in the region of the short-circuit. It is therefore necessary to package the stack within a protective enclosure defining a barrier to prevent intrusion of fuel and/or water due to leakage and/or permeation thereof.

In EP 0995901, for example, the piezoelectric stack is packaged within a coating or sleeve composed of a flexible sealant material. It is known to use an over-moulding technique to encapsulate the stack within a plastics coating, or to apply a sleeve as described in the Applicant's patent application WO 02/061856. Such an enclosure typically comprises a dielectric polymer material that is able to expand and contract with the actuation of the piezoelectric stack; the material must also accommodate strain due to the significant variation of hydrostatic fuel pressure within the accumulator volume that occurs cyclically in successive injection sequences. The enclosure is suitably formed from a fuel-resistant, low-permeability fluoropolymer such as, for example, polyvinylidene fluoride (PVDF) or ethylene tetrafluoroethylene (ETFE).

A polymer barrier will restrict permeation of fuel and water but will not stop it: it has been observed that there may still be ingress of fuel and water into the interface between the piezoelectric stack and the enclosure.

Ingress of fuel and/or water into the actuator may be driven by various mechanisms. One is the potential for chemical diffusion through the enclosure. Another is the strain on the enclosure due to transient fuel pressure cycling within the accumulator volume. Another is the hydrophilic effect of a predominantly unipolar electric field during operation of the injector. In this respect, a fuel injector valve is open only for very short periods of time during engine operation, i.e. when injecting fuel; the valve is closed for the majority of its operational time. In the much longer interim periods between injections, the piezoelectric stack must be continually energised at +200V to ensure that the valve remains closed. Over time, such is the imbalance between closed and open states that the high voltage of the closed state creates a predominantly unipolar electric field in and around the stack. Such a field has been shown to attract water as ions and/or molecules.

The permeation resistance of the barrier material is an important factor in the durability of a piezoelectric stack in a fuel injector. Metallizing a polymer barrier after assembly has been used to reduce the permeability of the barrier, but the present invention seeks to reduce the permeability of the barrier still further.

A dense metal enclosure would be an effective solution to the problem of permeation. However, the use of a metal enclosure is only possible if the enclosure can be made to withstand the strains experienced concurrently during actuation of the piezoelectric stack and during fuel pressure cycling within the accumulator volume of the injector. Also, being conductive, a metal enclosure has to be separated from the surface of the stack; otherwise, it could give rise to short-circuits between neighbouring electrodes in the stack.

The invention arises from the Applicant's efforts to provide an actuator with a metal enclosure around a piezoelectric stack. Whilst the features of the invention are particularly suited to the use of metal for such an enclosure and indeed are intended to enable the use of metal in that application, those features could be used with enclosures of other materials. Consequently, the invention is not limited, in its broadest sense, to a metal enclosure.

SUMMARY OF THE INVENTION

In the present invention an enclosure is provided for enclosing piezoelectric elements of a piezoelectric actuator, the enclosure being elongate to define a longitudinal axis. The enclosure comprises a side wall that is shaped to define at least one strain compensation formation selected from: a longitudinally-extensible part at which the side wall can be extended or contracted parallel to the longitudinal axis; and an inwardly-deflectable part at which the side wall can be deflected transversely to the longitudinal axis.

Advantageously, the longitudinally-extensible part allows the enclosure to expand and contract in a longitudinal direction, without damage, as the piezoelectric stack within the enclosure lengthens and contracts during use.

The inwardly-deflectable part enables the enclosure to experience strain, without damage, in a direction transverse to the longitudinal axis of the enclosure when the exterior of the enclosure experiences cyclic hydrostatic fuel pressures in use.

In one embodiment the enclosure comprises at least one longitudinally-extensible part and at least one inwardly-deflectable part. These strain compensation features operate independently, but with synergy, to accommodate the multiple strain modes of the enclosure.

It is preferred that the longitudinally-extensible part has at least one outwardly-protruding formation or at least one inwardly-recessed formation such as a groove. More preferably, the longitudinally-extensible part has at least one of each formation. Advantageously, superior flexibility is imparted to the longitudinally-extensible part when it comprises a plurality of protrusions and a plurality of grooves in alternating succession. Further, the protrusions and grooves may extend around the enclosure. Usefully, the number, length, height and depth of the protrusions and grooves can be selected to suit the extent to which the enclosure will be required to lengthen and contract in use.

The longitudinally-extensible part is suitably substantially circular or substantially octagonal in cross section. The cross-section of the longitudinally-extensible part may be substantially similar to the cross-section of the inwardly-deflectable part, or their cross-sections may differ substantially.

In a preferred embodiment, the enclosure comprises a plurality of longitudinally-extensible parts spaced along the length of the enclosure. The plurality of longitudinally-extensible parts transfer linear strain over the entire enclosure and help to compensate for any internal friction between the inwardly-deflectable part and the piezoelectric stack. An inwardly-deflectable part can be disposed between the longitudinally-extensible parts of said plurality and the relative lengths of each part can be adjusted to balance the stresses they experience. Both these features further enhance the distribution of stress over the entire enclosure.

The inwardly-deflectable part of the enclosure preferably has a cross-section comprising first and second portions, the first portion being more readily deflectable than the second portion when the same external hydrostatic pressure is applied to both portions. For example, the first portion may be resiliently flexible in the transverse direction, being capable of bowing inwardly and recovering elastically to a relatively flat shape as fuel pressure varies during the injection cycle. Therefore, the stiffer parts of the enclosure are isolated from pressure deformation stress and strain elsewhere in the enclosure is minimised.

The second portion may have a side wall portion that is more resistant to deflection than a side wall portion defining the first portion and is preferably substantially flat. As the second portion is narrower and hence stiffer, it supports the first portion, imparting stiffness to the enclosure as a whole.

The cross-section of the inwardly-deflectable part preferably comprises a plurality of first and second portions which may alternate around the cross-section. For example, the first and second portions may define a substantially octagonal cross section.

As with the longitudinally-extensible parts, a plurality of the inwardly-deflectable parts can also be spaced along the length of the enclosure.

Advantageously, the side wall of the enclosure is seamless; it is preferably composed of a substantially non-permeable material that may, for example, have leak resistance better than $1 \times 10^{-9}$ cc/sec of helium. It is much preferred that the side wall is metallic, as such materials have superior permeability resistance and heat transfer properties as compared to the polymer materials used in the prior art.

The invention encompasses the combination of a piezoelectric stack for a piezoelectric actuator and an enclosure for enclosing the piezoelectric stack. The combination comprises an elongate enclosure defining a longitudinal axis, where the enclosure comprises a side wall that is shaped to define at least one strain compensation formation selected from: a longitudinally-extensible part at which the side wall can be extended or contracted parallel to the longitudinal axis; and an inwardly-deflectable part at which the side wall can be deflected transversely to the longitudinal axis. The combination further comprises a stack that comprises a plurality of piezoelectric layers and defines a cross-sectional shape.

To minimise the internal volume between the stack and the enclosure, it is preferred that at least one of the longitudinally-extensible part and the inwardly-deflectable part of the side wall of the enclosure has a cross-section substantially similar in shape to the cross-sectional shape of the stack.

In preferred embodiments of the invention, the combination further comprises a clearance space between the stack and the enclosure. This clearance space enables a dielectric filler to be introduced around the stack and also allows the inwardly-deflectable part to deflect inwardly toward the stack when in use. It also is useful to include a passivation layer which surrounds the stack. The passivation layer and the dielectric filler fluid both protect the stack against short-circuits.

The combination of piezoelectric stack and enclosure described above can be applied to an actuator, and further, to a fuel injector having such an actuator.

The inventive concept also encompasses a method of manufacturing an enclosure for enclosing piezoelectric elements of a piezoelectric actuator. The method comprises: electrodepositing a metal onto an elongate mandrel defining a longitudinal axis, the mandrel being shaped to define at least one strain compensation formation in a layer of metal electrodeposited thereon to form a side wall of the enclosure, that formation being selected from a longitudinally-extensible part at which, once formed, the side wall can be extended or contracted parallel to the longitudinal axis and an inwardly-deflectable part at which the side wall can be deflected transversely to the longitudinal axis; and subsequently removing the mandrel. The invention also extends to a mandrel shaped for use in that method.

BRIEF DESCRIPTION OF THE DRAWINGS

In order that the invention may be more readily understood, reference will now be made, by way of example, to the accompanying drawings in which.

DETAILED DESCRIPTION OF THE INVENTION

Where dimensions are given in this specific description, they are given only for the purpose of illustration and are not intended to limit the invention in its broad sense.

Figure 1:
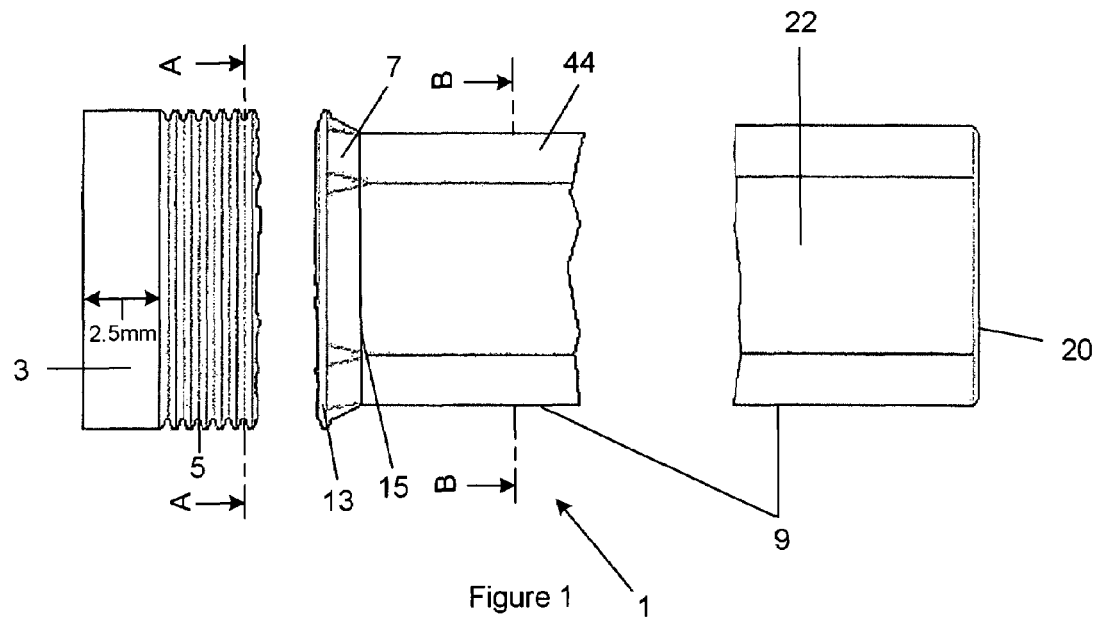
FIG. 1 is an interrupted side view of an actuator comprising an enclosure containing a piezoelectric stack, the enclosure having a longitudinally-extensible part and an inwardly-deflectable part.
Figure 7:
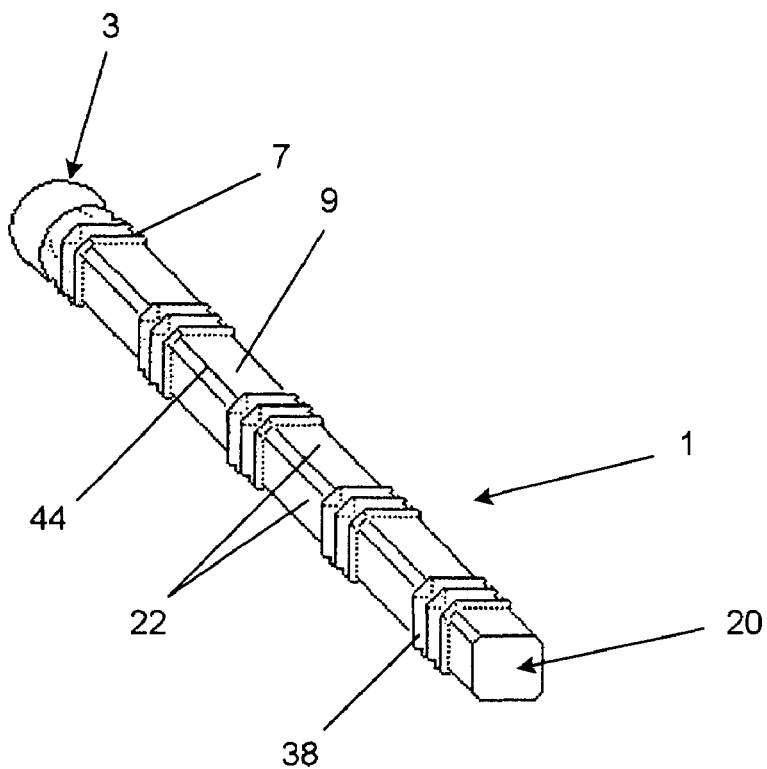
FIG. 7 is a perspective view of an enclosure for an actuator according to a conceptual visualisation of the invention.

FIG. 1 shows a hollow seamless enclosure 1 or can of nickel alloy containing a piezoelectric stack 26; the stack 26 is hidden by the enclosure 1 in this view. The enclosure 1 is much shortened by the interrupted view of FIG. 1: FIG. 7 shows a different embodiment but is indicative of the overall elongate proportions of the enclosure 1 of FIG. 1.

The enclosure 1 shown in FIG. 1 is generally tubular and comprises: an open top seal end 3; a longitudinally-extensible part 5 inboard of the top seal end 3; an inwardly-deflectable part 9 leading to a closed end 20; and a transition section 7 between the longitudinally-extensible part 5 and the inwardly-deflectable part 9.

The top seal end 3 and the longitudinally-extensible part 5 each have a circular cross-section; the outer diameter of the top seal end 3 corresponds to the maximum outer diameter of the longitudinally-extensible part 5. Conversely, the inwardly-deflectable part 9 comprises eight flat faces: four major faces 22 in two parallel and mutually orthogonal pairs alternate with four minor faces 44 disposed at 45° to each neighbouring major face 22 to define an irregular octagonal cross-section.

In the embodiment described, the length of the inwardly-deflectable part 9 is approximately 64.18 mm and its outer diameter between opposed major faces 22 is approximately 8.52 mm. The edges between the faces each have a radius of approximately 0.2 mm.

The transition section 7 has one end 13 that is circular in cross-section where it adjoins the longitudinally-extensible part 5 and another end 15 that is octagonal in cross-section where it adjoins the inwardly-deflectable part 9. Between those ends 13, 15, eight facets of the transition section 7 taper inwardly from the longitudinally-extensible part 5 to the inwardly-deflectable part 9. The length of the transition section 7 is approximately 1 mm.

Figure 2A:
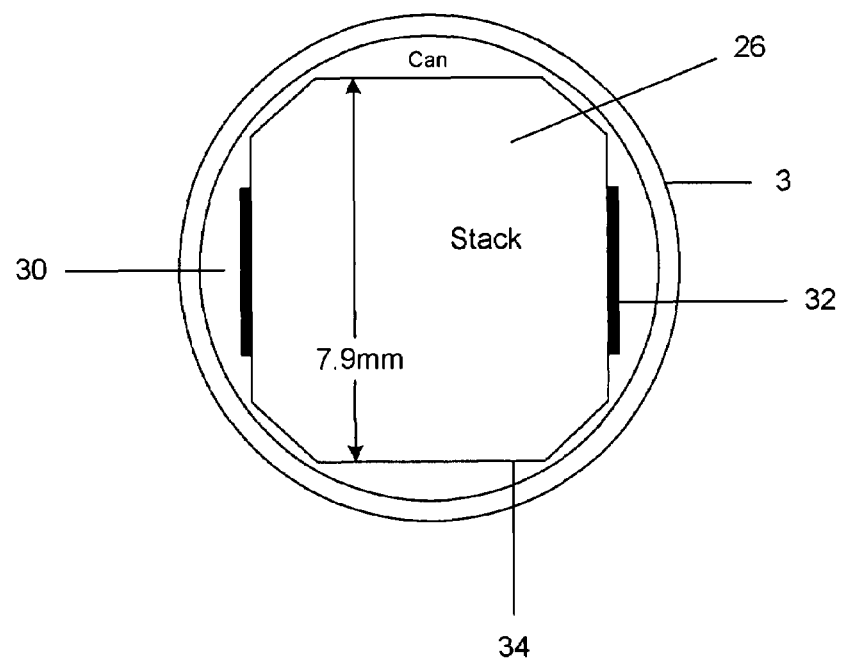
FIG. 2a is a cross-sectional view on line A-A of FIG. 1.
Figure 2B:
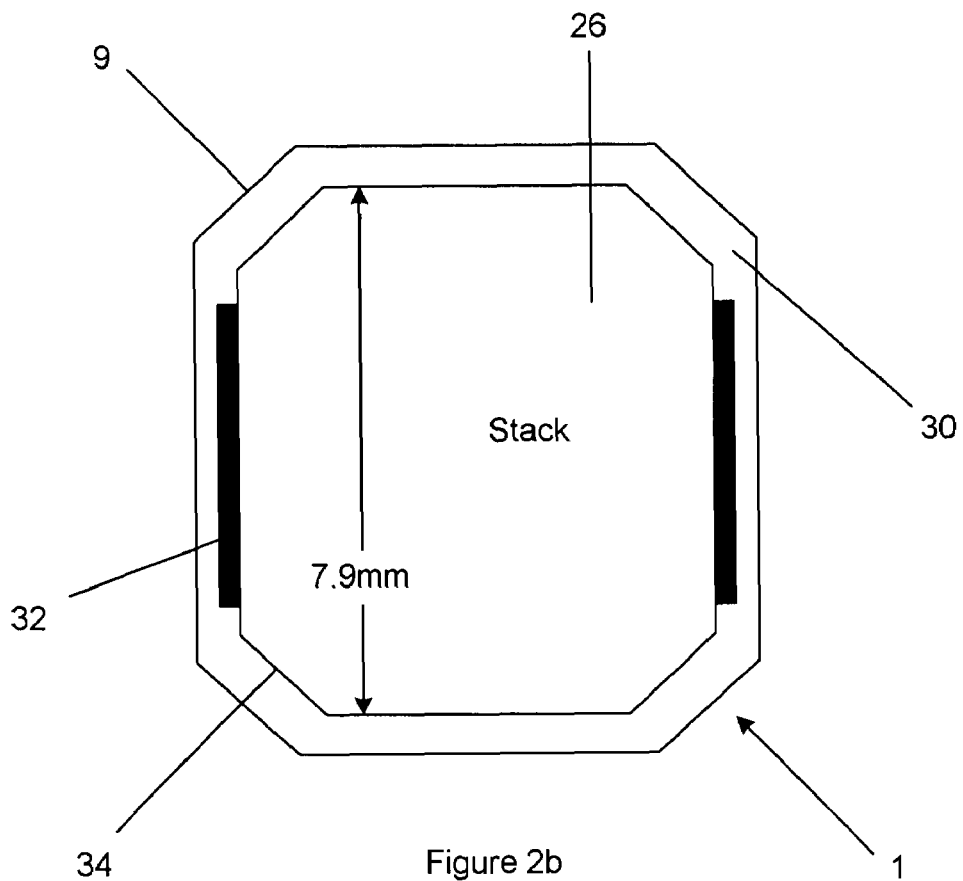
FIG. 2b is a cross-sectional view on line B-B of FIG. 1.

FIG. 2a and, particularly, FIG. 2b show that the piezoelectric stack 26 has an octagonal cross-section that is similar to, but proportionally smaller than, the octagonal cross-section of the inwardly-deflectable part 9 of the enclosure 1. A dielectric passivation layer 34 approximately 0.1 mm thick is applied to the external surface of the stack 26 and surrounds the stack 26.

The piezoelectric stack 26 has a diameter of approximately 7.9 mm between its opposed major faces 32 and fits closely within the inwardly-deflectable part 9. This ensures that the internal volume between the stack 26 and the enclosure 1 is minimal. However, a substantially uniform clearance of approximately 0.31 mm is maintained between the exterior of the stack 26 and the interior of the enclosure 1 within the inwardly-deflectable part 9. This clearance allows a dielectric filler fluid 30 to be introduced around the stack 26, as will be explained. This clearance also allows the major faces 22 of the inwardly-deflectable part 9 to deflect inwardly toward the stack 26 in use, as will also be explained.

At the top seal end 3, and within the longitudinally-extensible part 5 where the enclosure 1 has a circular section with an outer diameter of approximately 10.2 mm, there is a small clearance between the interior of the enclosure 1 and opposed minor faces of the piezoelectric stack 26. A greater clearance exists between the interior of the enclosure 1 and opposed major faces of the stack 26.

By way of illustration, the internal volume of the empty enclosure 1 is approximately 5510 mm$^3$, whereas the piezoelectric stack 26 complete with side electrodes and the passivation layer 34 has a volume of approximately 5281 mm$^3$ Thus, once assembled, the interior volume defined between the stack 26 and the enclosure 1 is approximately 229 mm$^3$.

Figure 3:
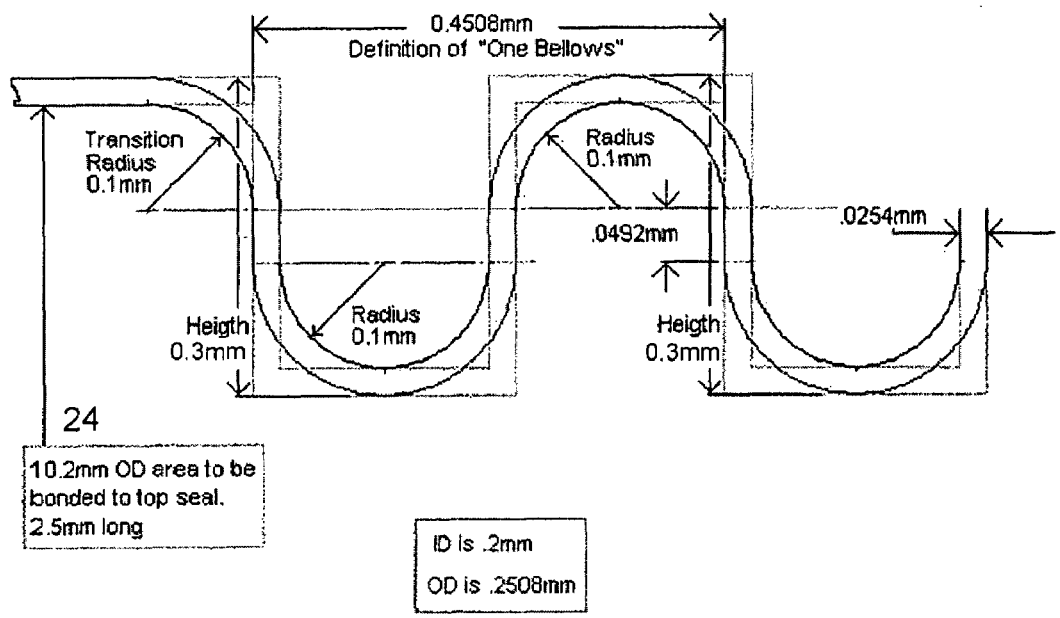
FIG. 3 is a schematic enlarged longitudinal sectional view of a corrugated wall defining the longitudinally-extensible part of the enclosure in FIG. 1.

It has already been mentioned that the longitudinally-extensible part 5 is inboard of the top seal end 3. As FIG. 3 shows, a tubular end portion 24 is defined between the longitudinally-extensible part 5 and the top seal end 3. In the example shown, that end portion 24 is approximately 10.2 mm in outer diameter and approximately 2.5 mm in length. It defines an inner bonding surface that is used to bond a sealing disc (not shown) to the enclosure 1 at the top seal end 3.

More specifically, the enclosure 1 is placed over the stack 26 and subsequently an inner sealing disc of ceramic or metal is attached to the enclosure 1 at the top seal end 3. The inner sealing disc fits closely into the top seal end 3 of the enclosure 1 and is bonded around its peripheral edge within the tubular end portion 24 of the enclosure 1. A polymer bond adhesive may be a used with a ceramic or metal sealing disc but, for optimum permeability resistance, it is preferred to use a metal sealing disc and to form a metallurgical bond with the metal enclosure 1 using common techniques such as soldering or laser welding.

The top seal end 3 further comprises an outer sealing disc (not shown) that lies on the inner sealing disc and is mounted within the tubular end portion of the enclosure 1 for angular movement with respect to the inner sealing disc. Again, the outer sealing disc may be of ceramic or metal but metal is preferred for lower permeability metallic bonding. The sealing discs each have a small hole in corresponding positions; by turning the outer sealing disc with respect to the inner sealing disc, the holes of the sealing discs may be selectively aligned to define a passageway for accessing the interior of the enclosure 1 through the discs. A dielectric filler fluid 30 may then be fed through the aligned holes into the space between the piezoelectric stack 26 and the interior of the enclosure 1.

The dielectric filler fluid 30 is preferably filled at ambient pressure and with ultrasonic agitation to prevent any gas bubbles forming during or after the filling process. Vacuum assistance may also be employed to remove gas during and/or after the filling process. Once the fluid 30 has filled the interior volume, the enclosure 1 is sealed by turning the outer sealing disc with respect to the inner sealing disc to misalign the holes and hence to close the passageway: the outer sealing disc is then bonded to the inner sealing disc to seal the enclosure 1.

Bonding of the outer sealing disc to the inner sealing disc can be accomplished with fuel-resistant adhesive or with solder. If the inner sealing disc was soldered to the enclosure 1, a solder with a lower melting point must be used to bond the outer sealing disc to the inner sealing disc. Of course, this is not a concern if the inner sealing disc was welded to the enclosure 1.

A dielectric filler fluid 30 suitable for use with the invention is Fluorinert FC-43, although alternative minimally-compressive materials with similar properties may be used instead. Desirable properties of a dielectric filler fluid 30 include: heat resistance; heat transfer ability, to absorb heat from the piezoelectric stack 26 for transfer to the enclosure 1 and from there to the fuel flowing around the enclosure 1; low water solubility; low viscosity; and low surface tension, to facilitate filling the intricate enclosure 1. Fluorinert FC-43 is a particularly useful selection as it has all of these properties and further, it is projected to compress by only 16% at 2000 bar.

The longitudinally-extensible part 5 enables the enclosure 1 to expand and contract in a longitudinal direction, without damage, as the piezoelectric stack 26 within the enclosure 1 lengthens and contracts under voltages applied to the piezoelectric elements of the stack 26 in use. The longitudinally-extensible part 5 is therefore longitudinally flexible and, preferably, also longitudinally resilient. Flexibility is imparted to the longitudinally-extensible part 5 by a series of annular corrugations comprising a succession of parallel alternating ridges and grooves. The corrugations define pleats or flutes of a bellows portion extending completely around the enclosure 1 and part-way along its length. For clarity, only some of the corrugations are shown in FIG. 1.

As best shown in the enlarged detail view of FIG. 3, the corrugations collectively define a longitudinal section that approximates to a waveform. Thus each corrugation comprises one crest and one root of the waveform; the crest and the root may also be expressed as a peak and a trough corresponding to the ridge and the groove respectively of each corrugation. The length of each corrugation, corresponding to the wavelength of the waveform, is the straight longitudinal distance from a given point on one corrugation to the corresponding point on an adjacent corrugation. The depth of each corrugation, expressed as the transverse distance between the crest and the root of each corrugation, is double the amplitude of the waveform.

The number of corrugations, their length and their depth can be selected to suit the extent to which the enclosure 1 will be required to lengthen and contract in use. By way of example, twenty-two corrugations, each having a length of approximately 0.45 mm, would give rise to a total bellows portion length of approximately 9.9 mm. It is envisaged that the wall thickness of the entire enclosure 1 including the longitudinally-extensible part 5 is approximately 0.0254 mm (i.e. one-thousandth of an inch) and that the depth of each individual corrugation is approximately 0.3 mm from the maximum outer diameter at a crest of the waveform to the minimum internal diameter at a root of the waveform. The radius of curvature at each root and each crest is approximately 0.1 mm. The transitional radius of curvature at each end of the bellows portion is also approximately 0.1 mm.

The inwardly-deflectable part 9 enables the enclosure 1 to experience strain, without damage, in a direction transverse to the longitudinal axis of the enclosure 1 when the exterior of the enclosure 1 experiences cyclic hydrostatic fuel pressures in use. Specifically, the major faces 22 of the inwardly-deflectable part 9 are resiliently flexible in the transverse direction, being capable of bowing inwardly and recovering elastically to a relatively flat shape as fuel pressure varies during the injection cycle. The minor faces 44 of the inwardly-deflectable part 9 are narrower and hence stiffer, thus supporting the major faces 22 and imparting stiffness to the enclosure 1 as a whole.

It will be recalled that FIG. 2b shows a clearance between the inside of the enclosure 1 within the inwardly-deflectable part 9 and the outside of the piezoelectric stack 26. This clearance allows the major faces 22 of the inwardly-deflectable part 9 to deform inwardly without risking a short-circuit of the electrodes in the piezoelectric stack 26. The dielectric passivation layer 34 and the dielectric filler fluid 30 around the stack 26 also protect the stack 26 against short-circuits.

Thus, the enclosure 1 has two principal elastic strain compensation features that enable the enclosure 1 to remain intact in use. The longitudinally-extensible part 5 is a linear strain compensation feature that compensates for the extension/retraction strain induced by the piezoelectric stack 26. The inwardly-deflectable part 9 is a transverse strain compensation feature that compensates for the strain induced by the fuel pressure cycling that occurs during injector operation.

The two strain compensation features of the enclosure 1 operate independently, but with synergy, to accommodate the multiple strain modes of the enclosure 1. The features are linked by the transition section 7 but extension or contraction of the longitudinally-extensible part 5 does not affect the length of the inwardly-deflectable part 9; nor does inward or outward deflection of the inwardly-deflectable part 9 affect the diameter of the longitudinally-extensible part 5. Consequently, the transition section 7 helps to isolate the adjacent parts from strains that they are not intended to handle, and so keeps stresses at acceptable levels.

The compliant major faces 22 of the inwardly-deflectable part 9 deform easily under high pressure to absorb the consequent volume reduction of the dielectric filler fluid 30, hence isolating the stiffer parts of the enclosure 1 from pressure deformation and minimising stress and strain elsewhere in the enclosure 1.

The number of corrugations in the bellows portion of the longitudinally-extensible part 5 determines the stress experienced by that part of the enclosure 1. Moreover, the relative lengths of the longitudinally-extensible part 5 and the inwardly-deflectable part 9 play some part in determining the relative stresses experienced by those parts. For example, a longer bellows portion reduces the elongation stress on the bellows during activation of the piezoelectric stack 26 but raises the stress on the flat faces of the inwardly-deflectable part 9. This is simply because shorter faces have a reduced area and they must deflect inwardly further to equilibrate the external fuel pressure to the interior dielectric fluid pressure. So, the relative lengths of the longitudinally-extensible part 5 and the inwardly-deflectable part 9 can be adjusted to balance the stresses they experience.

It is possible that in view of internal friction between the inwardly-deflectable part 9 and the piezoelectric stack 26, linear strain may not be completely transferred from the closed end 20 to a single bellows portion 5 at the opposite end of the enclosure 1. So, there may be more than one longitudinally-extensible part 5, for example one such part at each end of the enclosure 1.

Figure 4:
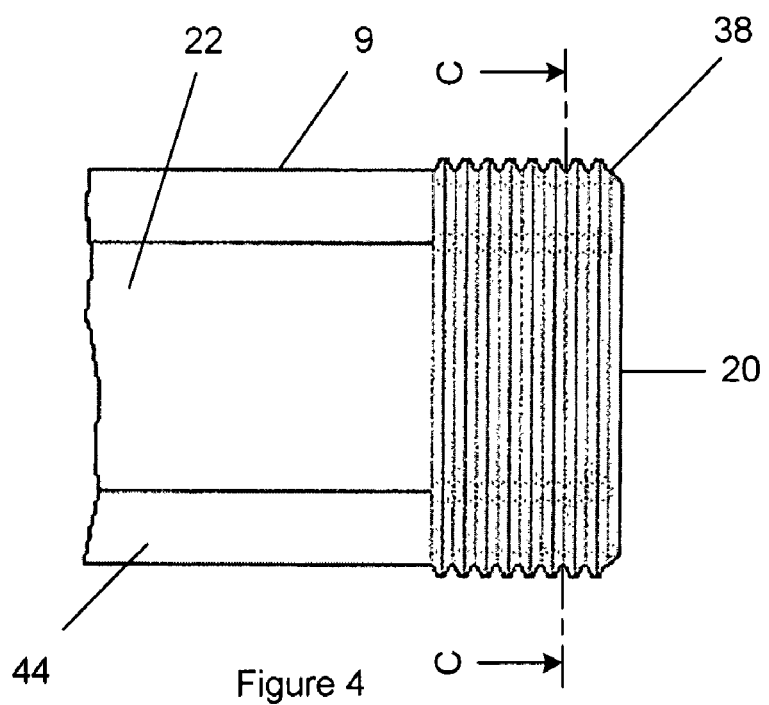
FIG. 4 is a partial side view of a variant of the enclosure of FIG. 1, this variant having an additional longitudinally-extensible part.

FIG. 4 shows a variant of the invention in which the enclosure 1 has a second longitudinally-extensible part 38 in the form of a second bellows portion 38 at the closed end 20 of the enclosure 1 on the opposite side of the inwardly-deflectable part 9. Locating a second bellows portion 38 at the closed end 20 of the enclosure 1 enables more even compensation for linear strain over the entire enclosure 1.

Figure 5:
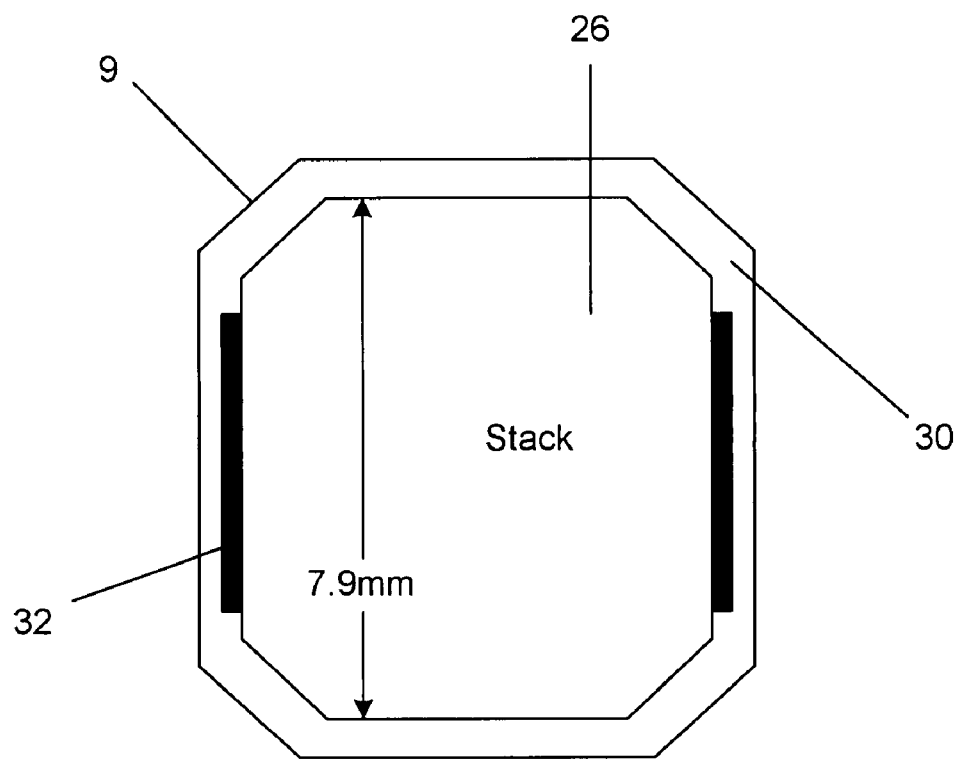
FIG. 5 is a cross-sectional view on line C-C of FIG. 4.

The cross-sectional view of the second bellows portion 38 in FIG. 5 shows that, like the inwardly-deflectable part 9, the second bellows portion 38 has a substantially similar octagonal cross-sectional shape to that of the piezoelectric stack 26. Again, there is clearance between the stack 26 and the second bellows portion 38 to allow space for the dielectric filler fluid 30.

Figure 6:
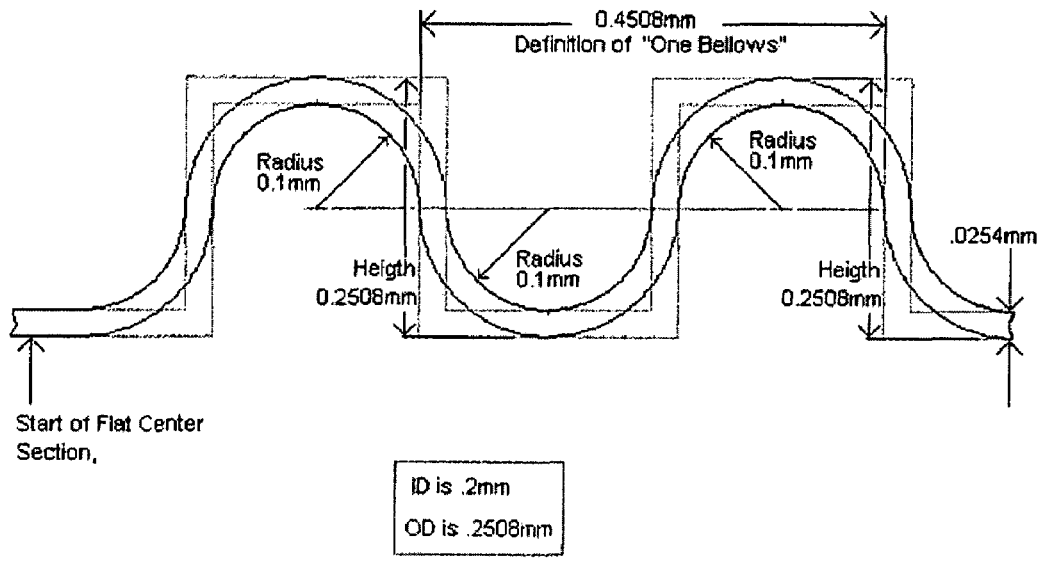
FIG. 6 is a schematic enlarged longitudinal sectional view of a corrugated wall defining the additional longitudinally-extensible part of the enclosure in FIG. 4.

The enlarged detail view of FIG. 6 shows that, like the bellows 5 shown in FIG. 3, the second bellows portion 38 has corrugations that collectively define an approximately waveform a longitudinal section. The dimensions of the waveform shown in FIG. 6 are similar to that shown in FIG. 3 but the amplitude of the waveform is smaller in FIG. 6; moreover the corrugations project outwardly rather than inwardly. Specifically, the height of each individual corrugation in FIG. 6 is approximately 0.251 mm from the maximum outer diameter at a crest of the waveform to the minimum internal diameter at a root of the waveform. This reflects that the second bellows portion 38 does not necessarily need to be as readily extensible as the first bellows portion 5.

FIG. 7 shows a conceptual visualisation of the invention having multiple strain compensation features including a plurality of longitudinally-extensible parts 5 and a plurality of inwardly-deflectable parts 9. This further enhances the distribution of stress over the entire enclosure 1. Specifically, the enclosure 1 shown in FIG. 7 comprises five bellows portions 5, 38 and five inwardly-deflectable parts 9 that alternate with each other along the length of the enclosure 1. Any number of such parts can be incorporated into the enclosure 1 to control stresses; their relative lengths and strain compensation properties can also be varied.

Components (not shown) used to link the closed end 20 of the enclosure 1 to an injector valve can be bonded to the enclosure 1 with fuel-resistant adhesives.

It is envisaged that the nickel alloy enclosure has a seamless, non-porous wall with leak resistance better than $1\times10^{-9}$ cc/sec of helium. To a temperature of approximately 177 degrees C., said nickel alloy has the following beneficial properties: a tensile strength of 862 MPa; a yield strength of 758 MPa; a Young's modulus of 161,034 MPa; minimum elongation of 1.0%; and a minimum Vickers hardness of 270. A nickel alloy enclosure of this type will have superior permeability resistance and heat transfer properties as compared to the polymer materials used in the prior art. However, it is possible that other alloys could be used to make the enclosure of the invention.

The enclosure may be formed by standard electro-deposition techniques, such as electrodepositing the nickel alloy onto an appropriately shaped mandrel and subsequently removing the mandrel. This is a well-known commercial method for making thin-wall leak-resistant metal products. The enclosure meets the published material limitations and guidelines for the manufacture of such products—for example 'Metal Bellows & Electroforms' published by Servometer Precision Manufacturing Group LLC of New Jersey, USA Many variations are possible within the inventive concept. For example, it is possible that an enclosure could use one, but not the other, of the two principal strain compensation feature types described above. For example there could be a longitudinally-extensible part providing linear strain compensation or an inwardly-deflectable part providing transverse strain compensation, but not necessarily both in the same enclosure. However, there is a desirable and preferred synergy in employing both types of strain compensation features together.

What is claimed is:

1. An enclosure for enclosing piezoelectric elements of a piezoelecoic actuator, the enclosure comprising:
   a side wall that is shaped to define at least one strain compensation formation including:
      at least one longitudinally-extensible part that is extensible along a longitudinal axis defined by the enclosure, at which the side wall can be extended or contracted along the longitudinal axis; and
      at least one inwardly-deflectable part, at which the side wall can be deflected transversely to the longitudinal axis,
   wherein the at least one longitudinally-extensible part and the at least one inwardly-deflectable part are linked by a transition section and operate independently from one another.

2. The enclosure of claim 1, wherein the longitudinally-extensible part comprises at least one outwardly-protruding formation.

3. The enclosure of claim 1, wherein the longitudinally-extensible part comprises at least one inwardly-recessed formation.

4. The enclosure of claim 1, wherein the longitudinally-extensible part comprises at least one outwardly-protruding formation and ac least one inwardly-recessed formation.

5. The enclosure of claim 4, wherein the outwardly-protruding formation is a protrusion and the inwardly-recessed formation is a groove, and wherein the longitudinally-extensible part comprises a plurality of protrusions and a plurality of grooves in alternating succession.

6. The enclosure of claim 1, wherein the longitudinally-extensible part extends around the enclosure.

7. The enclosure of claim 1, wherein the longitudinally-extensible part has a substantially circular cross-section.

8. The enclosure of claim 1, wherein the longitudinally-extensible part has a cross-section substantially similar to a cross-section of the inwardly-deflectable part.

9. The enclosure of claim 1, wherein the longitudinally-extensible part has a substantially octagonal cross-section.

10. The enclosure of claim 1 and having a plurality of longitudinally-extensible parts spaced along the length of the enclosure.

11. The enclosure of claim 10, wherein an inwardly-deflectable part is disposed between the longitudinally-extensible parts of said plurality.

12. The enclosure of claim 1, wherein the inwardly-deflectable part has a cross-section comprising first and second portions, the first portion being more readily deflectable than the second portion when the same external hydrostatic pressure is applied to both portions.

13. The enclosure of claim 11, wherein the second portion of the cross-tion is defined by a side wall portion that is more resistant to deflection than a side wall portion defining the first portion.

14. The enclosure of claim 12, wherein the first portion, of the cross-section is defined by a side wall portion that is substantially flat at rest.

15. The enclosure of claim 12, wherein the second portion of the cross-section is defined by a side wall portion that is substantially flat.

16. The enclosure of claim 12, wherein the first portion of the cross-section is longer than the second portion of the cross section.

17. The enclosure of claim 12 wherein the cross-section of the inwardly-deflectable part comprises a plurality of first and second portions.

18. The enclosure of claim 17, wherein the first and second portions alternate around the cross-section of the inwardly-deflectable part.

19. The enclosure of claim 18, wherein the alternating first and second portions define a substantially octagonal cross section.

20. The enclosure of claim 1 and comprising a plurality of inwardly-deflectable parts spaced along the length of tbc enclosure.

21. The enclosure of claim 1, wherein the side wall is seamless.

22. The enclosure of claim 1, wherein the side wall is composed of a substantially non-permeable material.

23. The enclosure of claim 22, wherein the material is metallic.

24. The enclosure of claim 22, wherein the material has leak resistance better than $1 \sqcup 10$-9 cc/sec of helium.

25. In combination, a piezoelectric stack for a piezoelectric actuator and an enclosure for enclosing the piezoelectric stack, the combination comprising:
   a stack comprising a plurality of piezoelectric layers and defining a cross-sectional shape; and
   an enclosure, the enclosure being elongate to define a longitudinal axis, wherein the enclosure comprises a side wall that is shaped to define at least one strain compensation formation including:
      at least one longitudinally-extensible part at which the side wall can be extended or contracted parallel to the longitudinal axis; and
      at least one inwardly-deflectable part at which the side wall can be deflected transversely to the longitudinal axis,
   wherein the at least one longitudinally-extensible part and the at least one inwardly-deflectable part are linked by a transition section and operate independently from one another.

26. The combination of claim 25, wherein at least one of the longitudinally-extensible part and the inwardly-deflectable part of the side wall of the enclosure has a cross-section substantially similar in shape to the cross-sectional shape of the stack.

27. The combination of claim 25, further comprising a clearance space between the stack and the enclosure.

28. The combination of claim 27, wherein the clearance space contains a dielectric filler.

29. The combination of claim 25, further comprising a passivation layer surrounding the stack.

30. A piezoelectric actuator comprising the combination of claim 25.

31. A fuel injector comprising the actuator of claim 30.

* * * * *